US011004736B2

(12) United States Patent
Chen et al.

(10) Patent No.: US 11,004,736 B2
(45) Date of Patent: May 11, 2021

(54) INTEGRATED CIRCUIT HAVING A SINGLE DAMASCENE WIRING NETWORK

(71) Applicant: INTERNATIONAL BUSINESS MACHINES CORPORATION, Armonk, NY (US)

(72) Inventors: Hsueh-Chung Chen, Cohoes, NY (US); Junli Wang, Slingerlands, NY (US); Somnath Ghosh, Clifton Park, NY (US); Chih-Chao Yang, Glenmont, NY (US); Lawrence A. Clevenger, Saratoga Springs, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/516,775

(22) Filed: Jul. 19, 2019

(65) Prior Publication Data

US 2021/0020507 A1    Jan. 21, 2021

(51) Int. Cl.
*H01L 21/768* (2006.01)
*H01L 23/528* (2006.01)
*H01L 23/532* (2006.01)
*H01L 23/522* (2006.01)

(52) U.S. Cl.
CPC .. *H01L 21/76879* (2013.01); *H01L 21/76816* (2013.01); *H01L 21/76831* (2013.01); *H01L 21/76871* (2013.01); *H01L 23/5226* (2013.01); *H01L 23/5283* (2013.01); *H01L 23/53209* (2013.01)

(58) Field of Classification Search
CPC ......... H01L 21/76879; H01L 23/53209; H01L 21/76831; H01L 23/5283; H01L 23/5226; H01L 21/76871; H01L 21/76816
See application file for complete search history.

(56) References Cited

U.S. PATENT DOCUMENTS

| | | | |
|---|---|---|---|
| 6,410,985 B1 | 6/2002 | Chan et al. | |
| 7,166,532 B2 | 1/2007 | Chun | |
| 7,338,893 B2 | 3/2008 | Engbrecht et al. | |
| 9,589,892 B2 | 3/2017 | Lin et al. | |
| 2004/0150108 A1 | 8/2004 | Buerke et al. | |

(Continued)

FOREIGN PATENT DOCUMENTS

WO    2018080513 A1    5/2018

OTHER PUBLICATIONS

Y. Ohoka, Yohba, et al., "Integration of High Performance and Low Cost Cu/Ultra Low-k SiOC(k=2.0) Interconnects with Self-formed Barrier Technology for 32nm-node and Beyond," Proceeding of IITC, 67-69, IEEE 2007.

(Continued)

*Primary Examiner* — Matthew L Reames
(74) *Attorney, Agent, or Firm* — Cantor Colburn LLP; James Nock

(57) ABSTRACT

A method for fabricating a multi-layered wafer includes depositing a metal liner following by a seed layer including a metal in a trench arranged in an inter-metal dielectric (IMD). An end of the trench contacts a metal via of an interconnect structure. Heat is applied to drive the metal of the seed layer into the IMD and form a barrier layer along a sidewall of the trench.

14 Claims, 18 Drawing Sheets

(56) References Cited

U.S. PATENT DOCUMENTS

| | | | |
|---|---|---|---|
| 2008/0280151 A1* | 11/2008 | Jourdan | H01L 21/76843 428/450 |
| 2010/0233876 A1* | 9/2010 | Matsumoto | H01L 21/28562 438/652 |
| 2012/0091588 A1* | 4/2012 | Miyoshi | H01L 21/28556 257/751 |
| 2014/0299988 A1 | 10/2014 | Cabral, Jr. et al. | |
| 2015/0108646 A1 | 4/2015 | Chae et al. | |
| 2017/0330797 A1* | 11/2017 | Lai | H01L 21/28556 |
| 2019/0006230 A1 | 1/2019 | Kuo et al. | |

OTHER PUBLICATIONS

H. Kudo, et al., "Copper Wiring Encapsulation with Ultra-thin Barriers to Enhance Wiring and Dielectric Reliabilities for 320nm Nodes and Beyond", Fujitsu Laboratories Ltd., IEEE 2007, 4 pages.

* cited by examiner

US 11,004,736 B2

INTEGRATED CIRCUIT HAVING A SINGLE DAMASCENE WIRING NETWORK

BACKGROUND

The present invention generally relates to fabrication methods and resulting structures for semiconductor devices. More specifically, the present invention relates to methods and resulting structures for integrated circuits (ICs) having a single damascene wiring network.

Generally, integrated circuits (ICs) include a plurality of semiconductor-based circuit elements (or semiconductor devices) communicatively coupled to one another and fabricated on a semiconductor substrate. A complex network of signal paths is routed to connect the circuit elements distributed on the surface of the substrate. To efficiently route these signals across the device, multilevel or multilayered schemes are used, for example, single or dual damascene wiring structures.

To form damascene wiring structures, an insulating layer is patterned with open trenches; a metal, such as copper or cobalt, is deposited in the trenches; and chemical-mechanical planarization (CMP) is used to remove the metal that extends above the top of the insulating layer. In single damascene structures, a single feature is filled with metal per stage, and in dual damascene structures, two features, e.g., a trench overlying a via, are filled with a single metal deposition step.

SUMMARY

Embodiments of the present invention are directed to a method for fabricating a multi-layered wafer. A non-limiting example of the method includes depositing a metal liner following by a seed layer including a metal in a trench arranged in an inter-metal dielectric (IMD). An end of the trench contacts a metal via of an interconnect structure. Heat is applied to drive the metal of the seed layer into the IMB and form a barrier layer along a sidewall of the trench.

Another non-limiting example of the method includes depositing a metal liner following by a seed layer including a metal in a trench arranged in an inter-metal dielectric (IMD). An end of the trench contacts a metal via of an interconnect structure, and the seed layer includes a first metal and a second metal. Heat is applied to drive the first metal into the IMD and form a barrier layer along a sidewall of the trench. The second metal remains in the seed layer.

Embodiments of the present invention are directed to a multi-layered wafer. A non-limiting example of the multi-layered wafer includes a metal line arranged in an inter-metal dielectric (IMD). A metal via is arranged normal to the metal line, and an end of the metal line contacts a metal via of an interconnect structure. A barrier layer is arranged on sidewalls of the metal line and the metal via. The barrier layer is not arranged at the interface between the metal via and the trench.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-6 depict a process flow for forming a portion of an IC according to embodiments of the present invention, in which:

FIG. 1 depicts a cross-sectional side view the portion of the IC subsequent to depositing a seed layer on a metal liner within a trench;

FIG. 2 depicts a cross-sectional side view of the portion of the IC that illustrates performing an anneal on the seed layer;

FIG. 3 depicts a cross-sectional side view of the portion of the IC subsequent to forming a barrier layer beneath the metal liner;

FIG. 4 depicts a cross-sectional side view of the portion of the IC subsequent to depositing a metal in the trenches;

FIG. 5 depicts a cross-sectional side view of the portion of the IC subsequent to planarizing the metal; and FIG. 6 depicts a cross-sectional side view of the portion of the IC through the Z-Z' axis of FIG. 5;

FIGS. 7-12 depict a process flow for forming a portion of an IC according to embodiments of the present invention, in which:

FIG. 7 depicts a cross-sectional side view the portion of the IC subsequent to depositing a seed layer on a metal liner within a trench;

FIG. 8 depicts a cross-sectional side view of the portion of the IC that illustrates performing an anneal on the seed layer;

FIG. 9 depicts a cross-sectional side view of the portion of the IC subsequent to forming a barrier layer beneath the metal liner;

FIG. 10 depicts a cross-sectional side view of the portion of the IC subsequent to depositing a metal in the trenches;

FIG. 11 depicts a cross-sectional side view of the portion of the IC subsequent to planarizing the metal; and FIG. 12 depicts a cross-sectional side view of the portion of the IC through the Z-Z' axis of FIG. 11;

FIGS. 13-18 depict a process flow for forming a portion of an IC according to embodiments of the present invention, in which:

FIG. 13 depicts a cross-sectional side view the portion of the IC subsequent to depositing a seed layer on a metal liner within a trench;

FIG. 14 depicts a cross-sectional side view of the portion of the IC subsequent to depositing a metal in the trench;

FIG. 15 depicts a cross-sectional side view of the portion of the IC that illustrates performing an anneal on the seed layer;

FIG. 16 depicts a cross-sectional side view of the portion of the IC subsequent to forming a barrier layer beneath the metal liner;

FIG. 17 depicts a cross-sectional side view of the portion of the IC subsequent to planarizing the metal; and FIG. 18 depicts a cross-sectional side view of the portion of the IC through the Z-Z' axis of FIG. 17.

Figure 1:
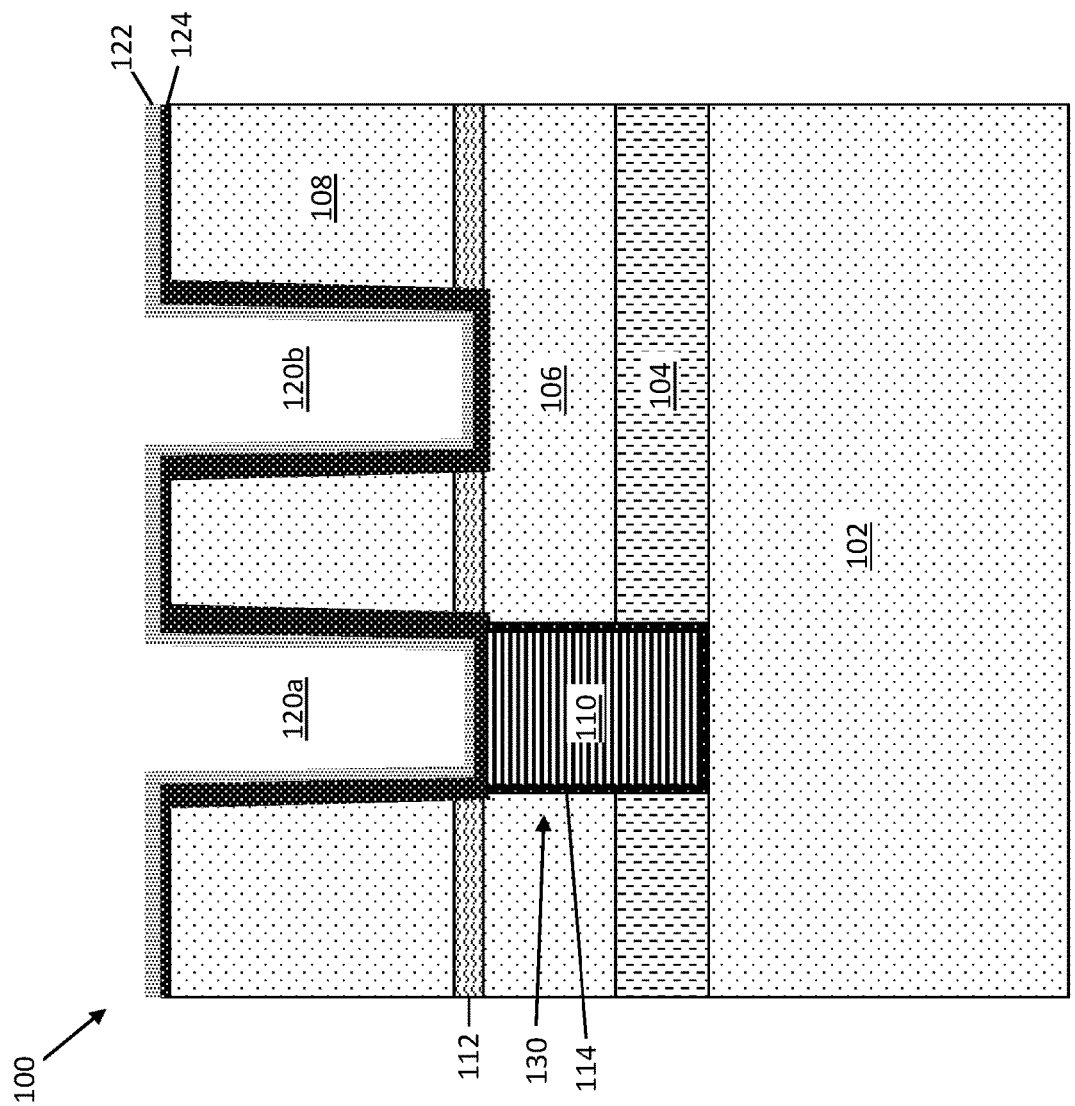

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, in single damascene structures, a barrier metal layer surrounds the metal interconnect to prevent metal from diffusing into surrounding dielectric materials, which would degrade the dielectric material properties. The barrier metal therefore should chemically isolate the metal conductor from other materials, yet have high electrical conductivity in order to maintain favorable electronic contact. However, barrier metal liners arranged at the interface between the metal line and the metal via can increase the vertical resistance between wiring levels.

Turning now to an overview of the aspects of the invention, one or more embodiments of the invention address the above-described shortcomings of the prior art by providing a single damascene process and resulting structure that includes depositing a metal seed layer in a trench and annealing to drive a metal into the surrounding dielectric to form a barrier layer. The barrier layer therefore results from reaction of a metal from the metal seed layer and the surrounding dielectric. A metal, such as copper or cobalt, is deposited to fill the trench, which can be performed before or after annealing to form the barrier layer.

The above-described aspects of the invention address the shortcomings of the prior art by forming a barrier layer directly in the surrounding dielectric of a trench without having to deposit a separate barrier layer between the trench forming a metal layer and the connecting via. Absence of a separate thick barrier layer (e.g., about 0.1 to 10 nm) between the metal layer and the via of the interconnect prevents undesired increases in device resistance.

Turning now to a more detailed description of aspects of the present invention, FIGS. 1-6 depict a process flow for forming a portion of an IC wafer 100 according to embodiments of the present invention. FIG. 1 depicts a cross-sectional side view the portion of the IC wafer 100, subsequent to depositing a seed layer 122 on a metal liner 124 within trenches 120*a*, 120*b*. Although two trenches 120*a*, 120*b* are shown in the portion of the IC wafer 100, portions of the IC wafer 100 formed according to embodiments of the present invention can include any number of trenches 120*a*, 120*b*. Semiconductor devices 100 can include one trench, two trenches, or a plurality of trenches.

The portion of the IC wafer 100 includes an etch stop layer 104 arranged on a substrate 102. The substrate 102 can include a semiconducting material, a conducting material, an insulating material, or any combination thereof. When the substrate 102 includes a semiconducting material, any material having semiconductor properties such as, for example, Si, SiGe, SiGeC, SiC, Ge alloys, GaAs, InAs, InP and other III/V or II/VI compound semiconductors, can be used. The substrate 102 can be a layered semiconductor such as, for example, Si/SiGe, Si/SiC, silicon-on-insulators (SOIs) or silicon germanium-on-insulators (SGOIs). When the substrate 102 includes an insulating material, the insulating material can be an organic insulator, an inorganic insulator or a combination thereof, including multilayers. When the substrate 102 includes a conducting material, the substrate 102 can include, for example, polysilicon, an elemental metal, alloys of elemental metals, a metal silicide, a metal nitride or any combination thereof, including multilayers. When the substrate 102 includes a semiconducting material, one or more semiconductor devices such as, for example, complementary metal oxide semiconductor (CMOS) devices can be fabricated thereon. When the substrate 102 includes a combination of an insulating material and a conductive material, the substrate 102 can represent an underlying interconnect level of a multilayered interconnect structure. The substrate 102 can include, for example, contact, cap, transistor, capacitor, and/or resistor structures. The etch stop layer 104 can include, for example, NiC, SiN, SiCN, SiBCN, or any combination thereof.

The portion of the IC wafer 100 includes an inter-metal dielectric (IMD 106) arranged on the etch stop layer 104. The IMD 106 includes, for example, an inorganic dielectric or organic dielectric. The IMD 106 is deposited by a deposition process, including, but not limited to chemical vapor deposition (CVD), physical vapor deposition (PVD), plasma enhanced CVD, atomic layer deposition (ALD), evaporation, chemical solution deposition, or like processes. Non-limiting examples of IMD 106 materials include $SiO_2$, silsesquioxanes, carbon-doped oxides (i.e., organosilicates) that include atoms of Si, C, O and H, thermosetting polyarylene ethers, or multilayers thereof. The IMD 106 can be a low-k or ultra-low-k dielectric material with a dielectric constant that is about 4.0 or less, or a dielectric constant of about 2.8 or less.

The portion of the IC wafer 100 includes a via 130 that extends through the etch stop layer 104 and the IMD 106. The via 130 is formed by a trench or opening that extends through the etch stop layer 104 and the IMD 106.

The via 130 includes a liner 114 arranged on the vertical and bottom sidewalls of the trench. The liner 114 is a plating seed layer formed on the surface of the barrier layer 110. The liner 114 selectively promotes subsequent electroplating of a pre-selected conductive metal or metal alloy. The liner 114 can include, for example, cobalt (Co), a Co alloy, copper (Cu), a Cu alloy, iridium (Ir), an Ir alloy, ruthenium (Ru), a Ru alloy (e.g., TaRu alloy), titanium (Ti), a Ti alloy (e.g., TiN), or a combination thereof.

The via 130 includes a metal 110 deposited on the liner 114 that fills the trench in the etch stop layer 104 and IMD 106. The metal 110 can include a conductive metal, an alloy including at least one conductive metal, a conductive metal silicide or combinations thereof. The metal 110 can be a conductive metal, such as copper (Cu), tungsten (W), aluminum (Al), cobalt (Co), ruthenium (Ru), rhodium (Rh), platinum (Pt), or any combination thereof. In one or more embodiments of the present invention, the metal 110 includes Co or a Co alloy. The metal 110 is deposited by a deposition process, including, by not limited to, CVD, PECVD, sputtering, chemical solution deposition or plating that fills from the bottom upwards (e.g., a bottom-up plating process).

The portion of the IC wafer 100 includes another etch stop layer 112 arranged on the IMD 106 and another IMD 108 on the etch stop layer 112. The etch stop layer 112 includes, for example, NiC, SiN, SiCN, SiBCN, or any combination thereof.

The IMD 108 includes, for example, an inorganic dielectric or organic dielectric. Non-limiting examples of IMD 108 materials include $SiO_2$, silsesquioxanes, carbon-doped oxides (i.e., organosilicates) that include atoms of Si, C, O and H, thermosetting polyarylene ethers, or multilayers thereof. The IMD 108 can be a low-k or ultra-low-k dielectric material with a dielectric constant that is about 4.0 or less, or a dielectric constant of about 2.8 or less.

The trenches 120a, 120b formed in the IMD 108 further extend through the etch stop layer 112, such that at least one trench, such as trench 120a contacts the via 130 to form an interconnect. The trenches 120a, 120b are formed by etching, for example, reactive ion etching (ME). The trench 120a forms a metal line and is arranged normal to the via 130 (see FIG. 6).

The metal liner 124 is arranged on the vertical and bottom sidewalls of the trenches 120a, 120b. The metal liner 124 is a plating seed layer that selectively promotes subsequent electroplating of a pre-selected conductive metal or metal alloy. The metal liner 124 can include, for example, cobalt (Co), a Co alloy, copper (Cu), a Cu alloy, iridium (Ir), an Ir alloy, ruthenium (Ru), a Ru alloy (e.g., TaRu alloy), titanium (Ti), a Ti alloy (e.g., TiN), or a combination thereof. According to one or more embodiments of the present invention, the metal liner 124 includes Co or Ru.

The seed layer 122 is deposited on the metal liner 124. The seed layer 124 includes a pure metal. The seed layer 124 is deposited by a deposition process, which can be PVD in one or more embodiments of the present invention. According to some embodiments of the present invention, the seed layer 124 includes pure manganese (Mn). Other non-limiting examples of pure metals for the seed layer 124 include manganese alloys, such as, copper-manganese alloys with 0.5% manganese, or 2% manganese.

Figure 2:
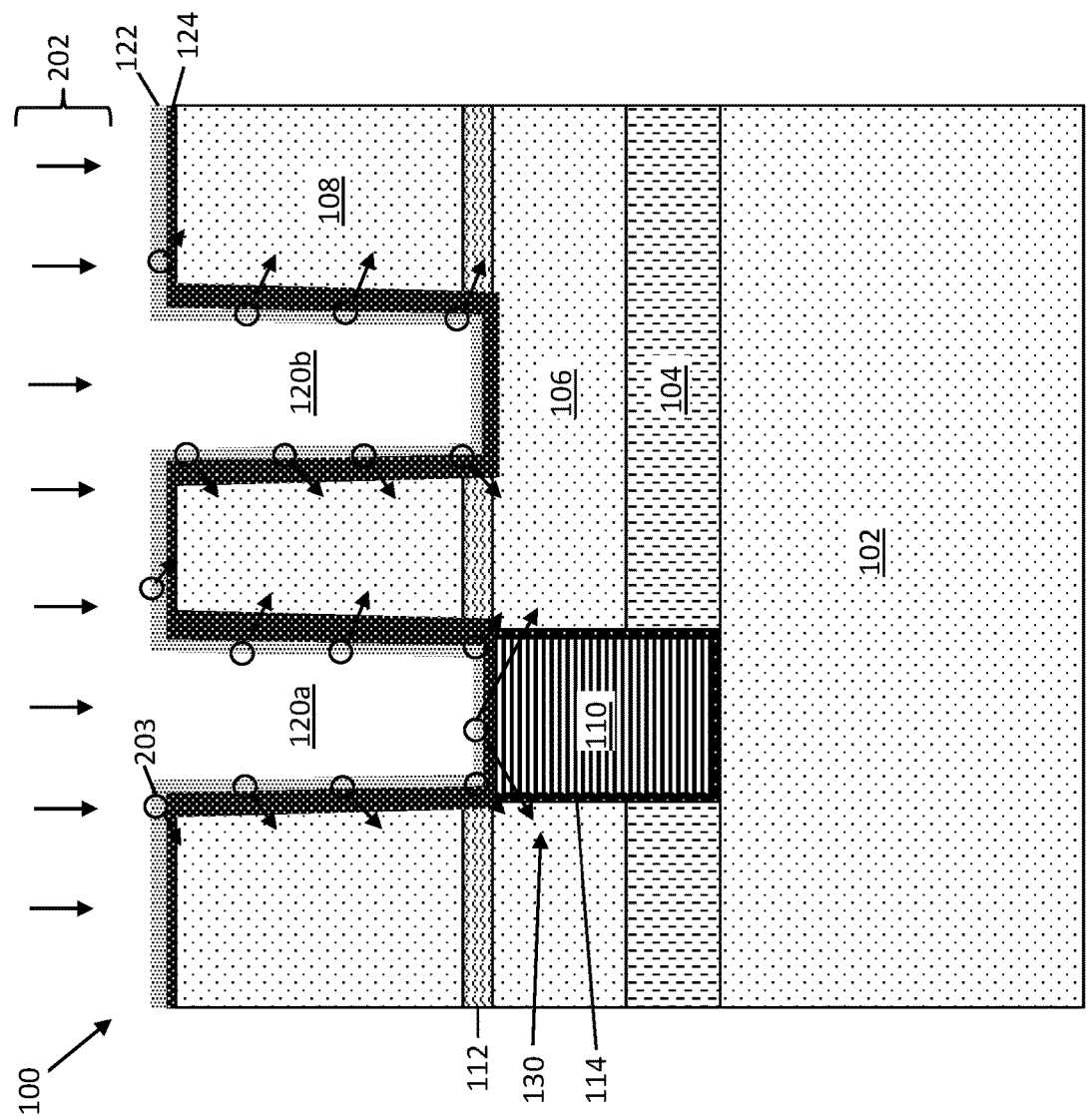

FIG. 2 depicts a cross-sectional side view of the portion of the IC wafer 100 that illustrates performing an anneal on the seed layer 122. Annealing includes applying heat 202 to the portion of the IC wafer 100 under a vacuum. Annealing drives the metal 203 from the seed layer 112 through the metal liner 124 into the surrounding IMD 106, 108.

Annealing can be performed inside a furnace or oven, or performing a rapid thermal treatment in an atmosphere containing pure inert gases (e.g., nitrogen or argon). The anneal process can be, for example, a Rapid Thermal Anneal (RTA) or Rapid Thermal Processing (RTP).

Annealing temperature can vary depending on the composition of the seed layer 122 and portion of the IC wafer 100. According to one or more embodiments of the present invention, the annealing temperature is about 100 to about 400° C.

Figure 3:
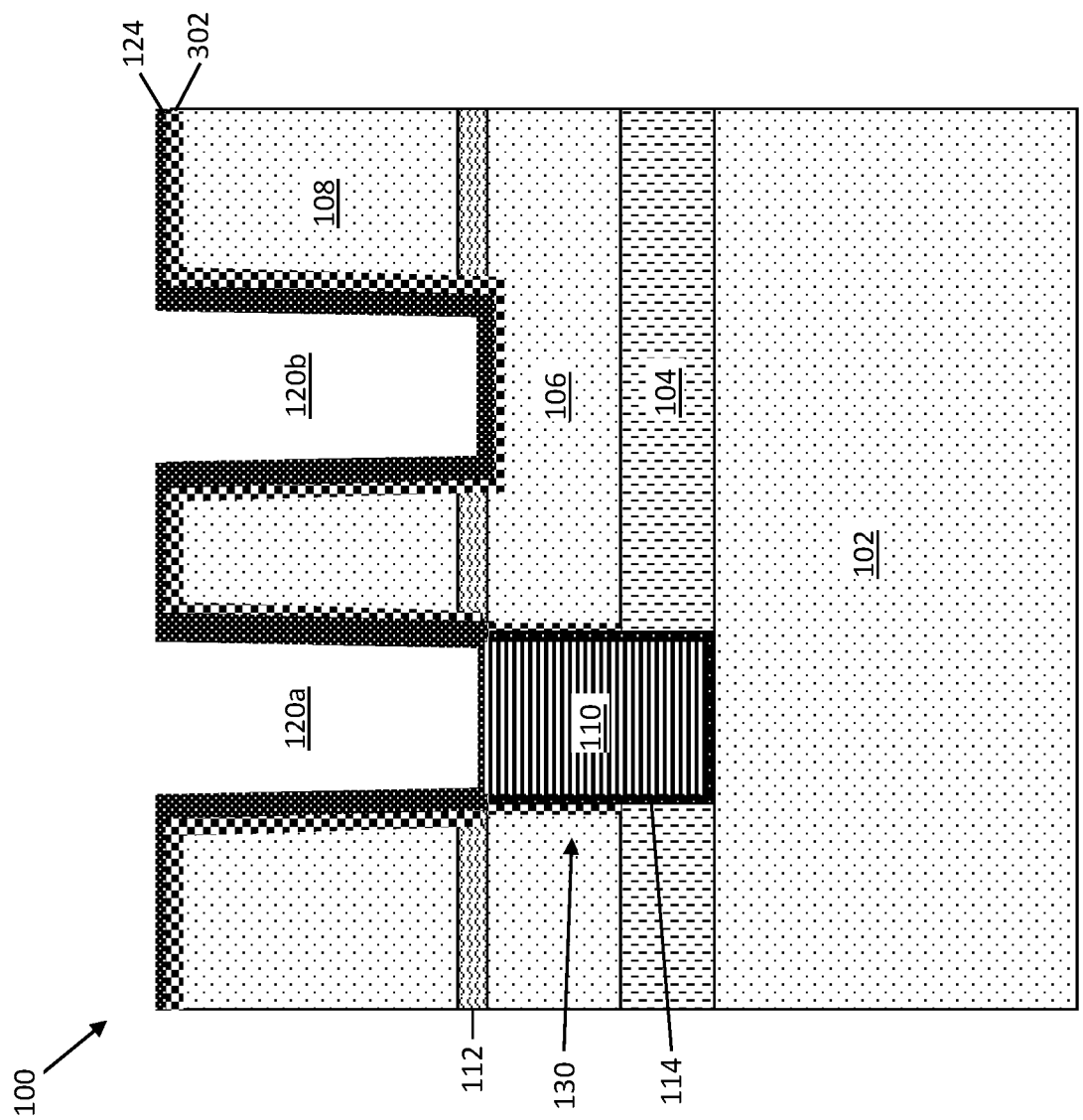

FIG. 3 depicts a cross-sectional side view of the portion of the IC wafer 100, subsequent to forming a barrier layer 302 beneath the metal liner 124. The metal 203 from the seed layer 122 (see FIG. 2) reacts with the material of the IMD 106, 108 and forms the material of the barrier layer 302. The barrier layer 302 lines the sidewalls of the trenches 120a, 120b and the via 130 that contact the IMD 106, 108. The barrier layer 302 includes a compound that results from a reaction of the metal 203 of the seed layer 122 and a compound in the IMD 106, 108.

According to one or more embodiments of the present invention, the metal 203 of the seed layer 122 includes Mn, either one or both of the IMD 106, 108 includes $SiO_2$, and the barrier layer 302 includes $MnSiO_3$.

Figure 4:
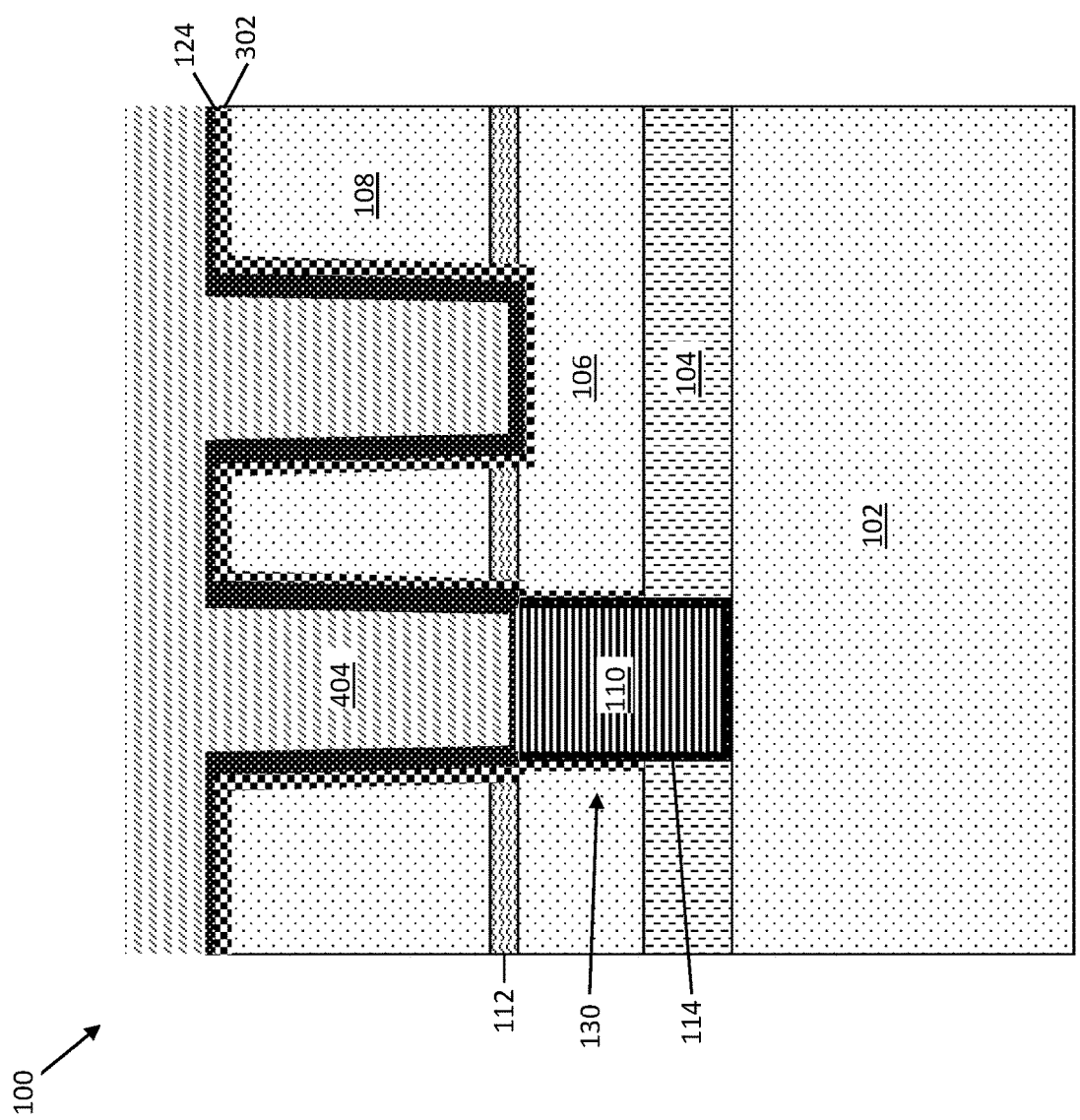

FIG. 4 depicts a cross-sectional side view of the portion of the IC wafer 100, subsequent to depositing a metal 404 in the trenches 120a, 120b. The metal 404 is deposited directly onto the metal liner 124 to fill the trenches 120a, 120b in the IMD 108.

The metal 404 can include a conductive metal, an alloy including at least one conductive metal, a conductive metal silicide or combinations thereof. The metal 404 can be a conductive metal, such as copper (Cu), tungsten (W), aluminum (Al), cobalt (Co), ruthenium (Ru), rhodium (Rh), platinum (Pt), or any combination thereof. The metal 404 is deposited by a deposition process, including, by not limited to, CVD, PECVD, sputtering, chemical solution deposition or plating that fills from the bottom upwards (e.g., a bottom-up plating process).

In one or more embodiments of the present invention, each of the metal 404, metal liner 124, and the metal 110 of the via 130 includes the same metal, such as Co.

Figure 5:
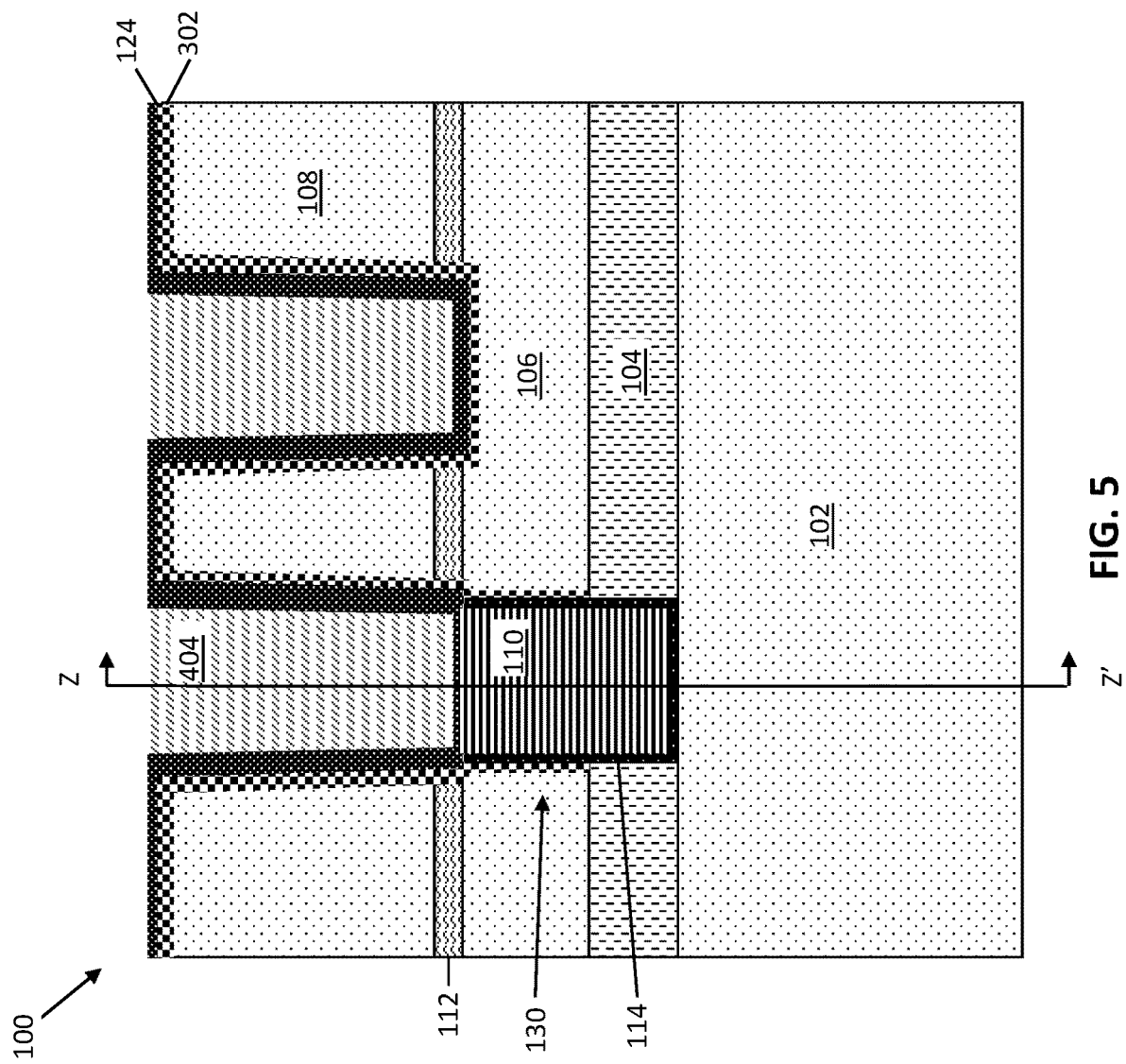

FIG. 5 depicts a cross-sectional side view of the portion of the IC wafer 100, subsequent to planarizing the metal 404. The excess metal 404 arranged on the surface of the IMD 108 is removed by polishing, for example, by chemical mechanical planarization (CMP).

Figure 6:
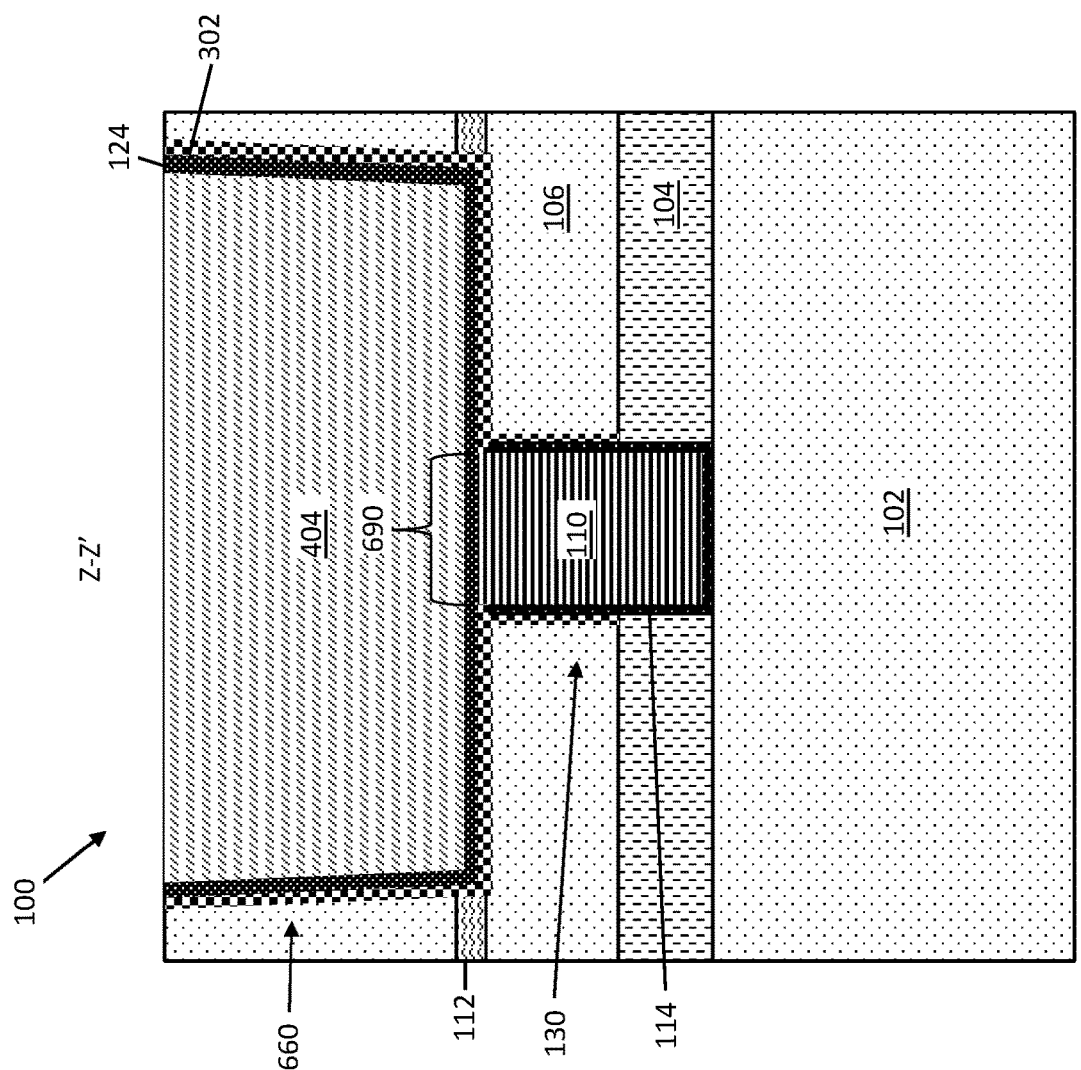

FIG. 6 depicts a cross-sectional side view of the portion of the IC wafer 100 through the Z-Z' axis of FIG. 5. The metal 404 fill forms the metal line 660 arranged normal to the via 130 and forms the interconnect structure in the portion of the IC wafer 100.

The barrier layer 302 lines all sidewalls of the metal line 660, which prevents diffusion of the metal 404 into the IMD 106, 108. The barrier layer 302 also lines sidewalls of the via 130 in the IMD 106, which also prevents diffusion of the metal 110 into the IMD 106. The barrier layer 302 is not arranged at the interface 690 between the via 130 and the metal line 660, which prevents increased device resistance that can occur when the barrier layer 302 is arranged between the metal line 606 and the via 130.

Figure 7:
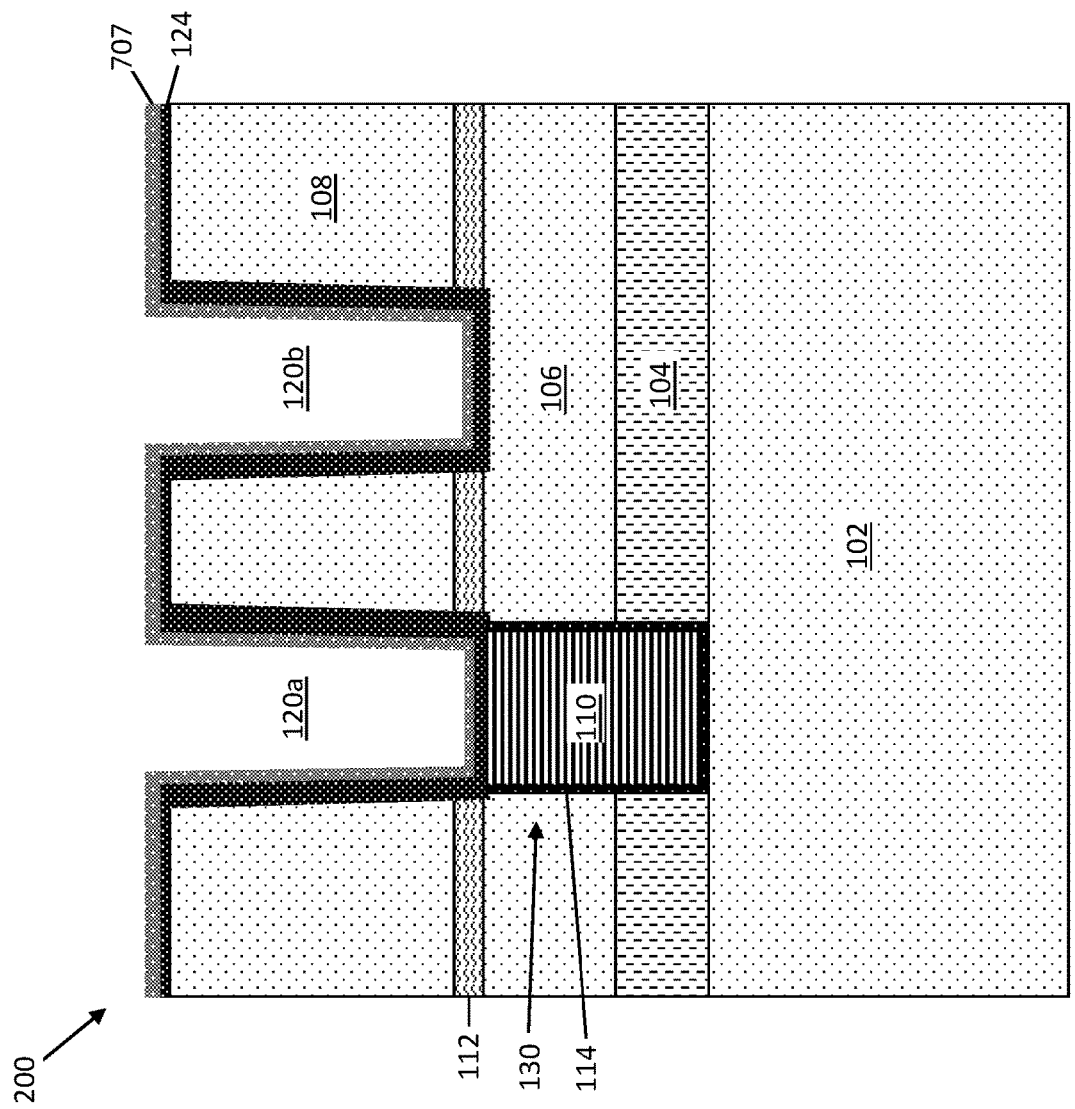

FIGS. 7-12 depict a process flow for forming a semiconductor device 200 according to embodiments of the present invention. FIG. 7 depicts a cross-sectional side view the semiconductor device 200, subsequent to depositing a seed layer 707 on a metal liner 124 within trenches 120a, 120b.

The seed layer 707 is deposited on the metal liner 124. The seed layer 707 includes at least two metals, such as a first metal and a second metal. The seed layer 707 is deposited by a deposition process, which can be PVD in one or more embodiments of the present invention. According to some embodiments of the present invention, the seed layer 707 includes manganese (Mn) (a first metal) and copper (Cu) (a second metal). Other non-limiting examples of metals for the seed layer 124 include manganese alloys, such as copper-manganese alloys with 0.5% or 2% manganese.

Figure 8:
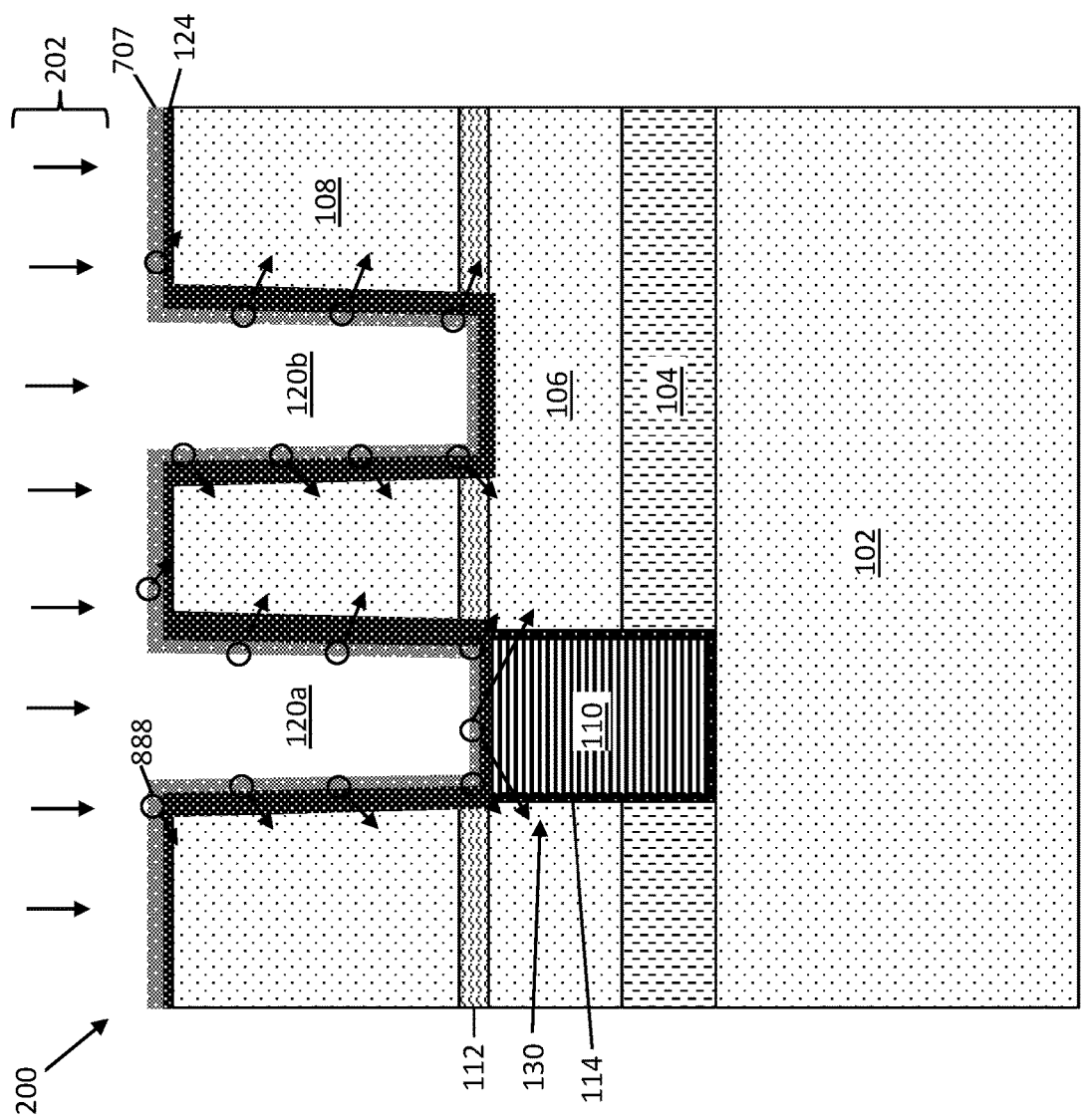

FIG. 8 depicts a cross-sectional side view of the semiconductor device 200 that illustrates performing an anneal on the seed layer 707. Annealing includes applying heat 202 to the semiconductor device 200. Annealing drives at least one metal 888 from the seed layer 707 through the metal liner 124 into the surrounding IMD 106, 108. Annealing can be performed as described above with respect to FIG. 2.

According to some embodiments of the present invention, the seed layer 707 includes copper (Cu) and manganese (Mn), the Mn (first metal) is driven into the IMD 106, 108, and the copper (Cu) (second metal) remains on the surface of the metal liner 124 in the seed layer 707.

Figure 9:
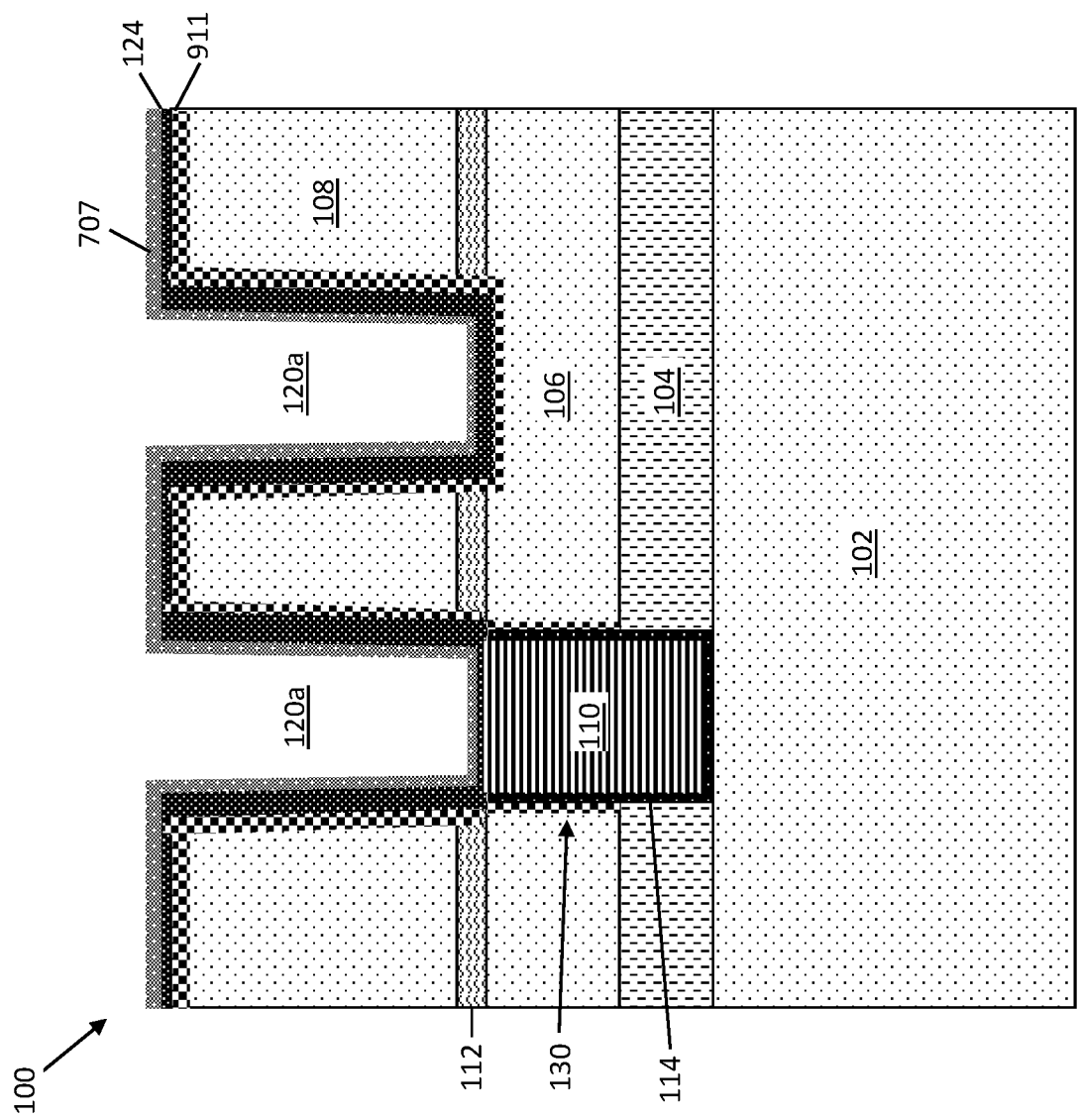

FIG. 9 depicts a cross-sectional side view of the semiconductor device 200, subsequent to forming a barrier layer 911 beneath the metal liner 124. One or more metals from the seed layer 707 (see FIG. 8) reacts with the material of the IMD 106, 108 and forms the material of the barrier layer 911. The barrier layer 911 lines the sidewalls of the trenches 120a, 120b and the via 130 that contact the IMD 106, 108. The barrier layer 911 includes a compound that results from a reaction of one or more of the metals 888 of the seed layer 707 and the IMD 106, 108. At least one metal remains in the seed layer 707.

According to one or more embodiments of the present invention, the metal 888 of the seed layer 707 includes Cu and Mn prior to the anneal, either one or both of the IMD 106, 108 includes $SiO_2$, and the resulting barrier layer 911 includes $MnSiO_3$. After the Mn diffuses into the IMD 106, 108, Cu remains in the seed layer 707.

Figure 10:
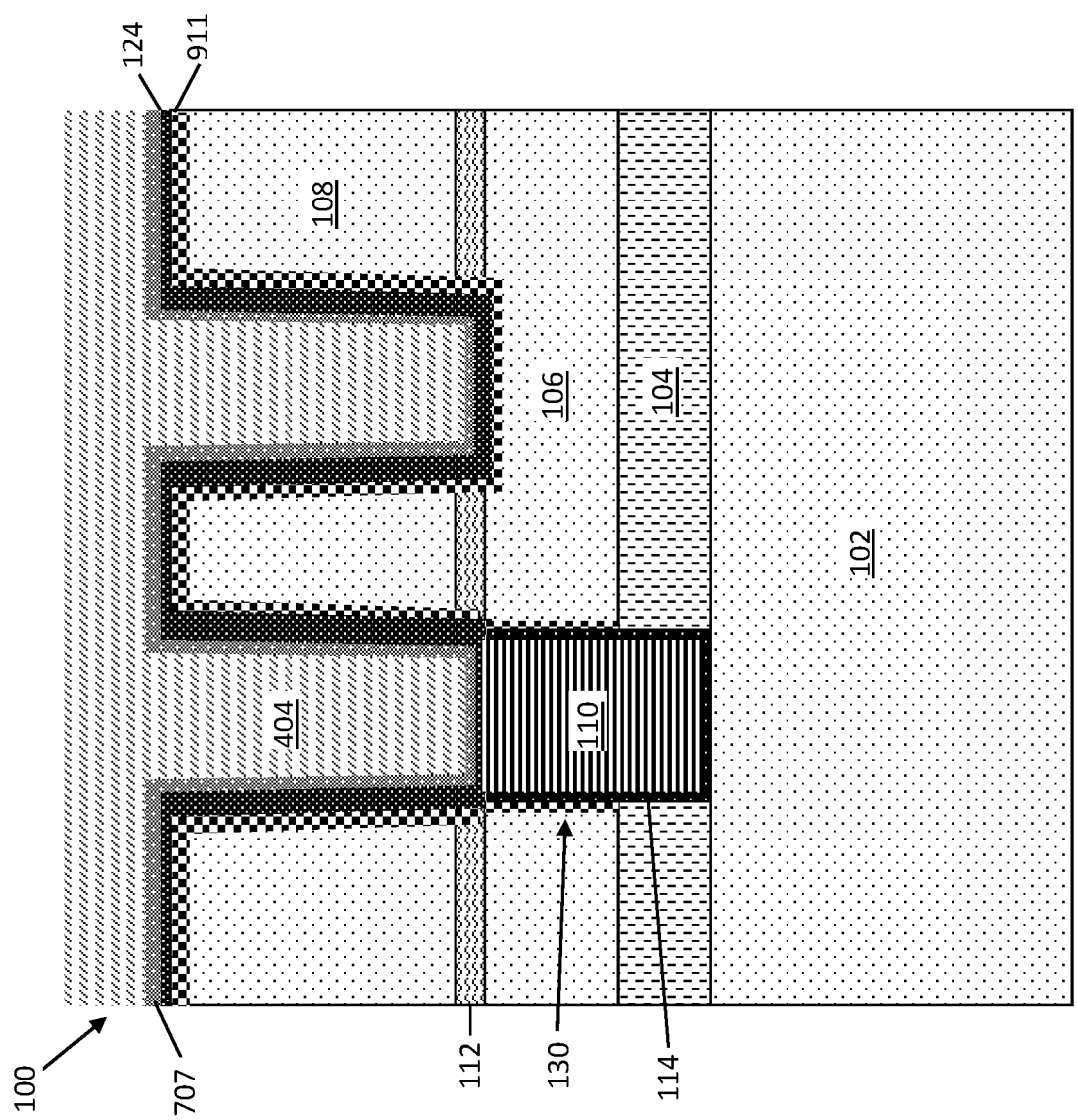

FIG. 10 depicts a cross-sectional side view of the semiconductor device 200, subsequent to depositing a metal 404 in the trenches. The metal 404 is deposited directly onto the seed layer 707 to fill the trenches 120a, 120b in the IMD 108.

The metal 404 can include a conductive metal, an alloy including at least one conductive metal, a conductive metal silicide or combinations thereof. The metal 404 can be a conductive metal, such as copper (Cu), tungsten (W), aluminum (Al), cobalt (Co), ruthenium (Ru), rhodium (Rh), platinum (Pt), or any combination thereof. The metal 404 is deposited by a deposition process, including, by not limited to, CVD, PECVD, sputtering, chemical solution deposition or plating that fills from the bottom upwards (e.g., a bottom-up plating process).

In one or more embodiments of the present invention, each of the metal 404 includes copper, and the metal remaining in the seed layer 707 after annealing is copper.

Figure 11:
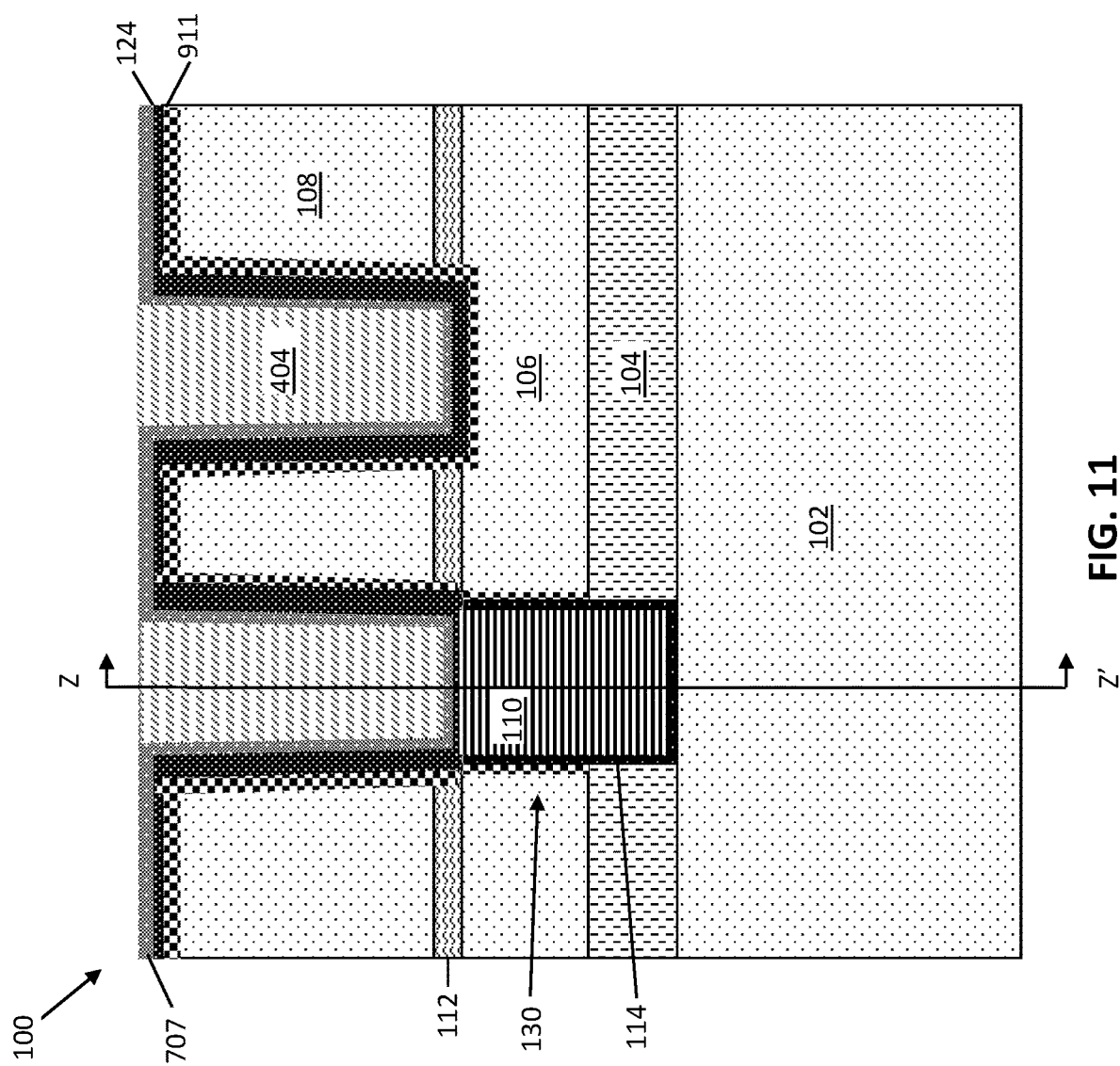

FIG. 11 depicts a cross-sectional side view of the semiconductor device 200, subsequent to planarizing the metal 404. The excess metal 404 arranged on the surface of the IMD 108 is removed by polishing, for example, by chemical mechanical planarization (CMP).

Figure 12:
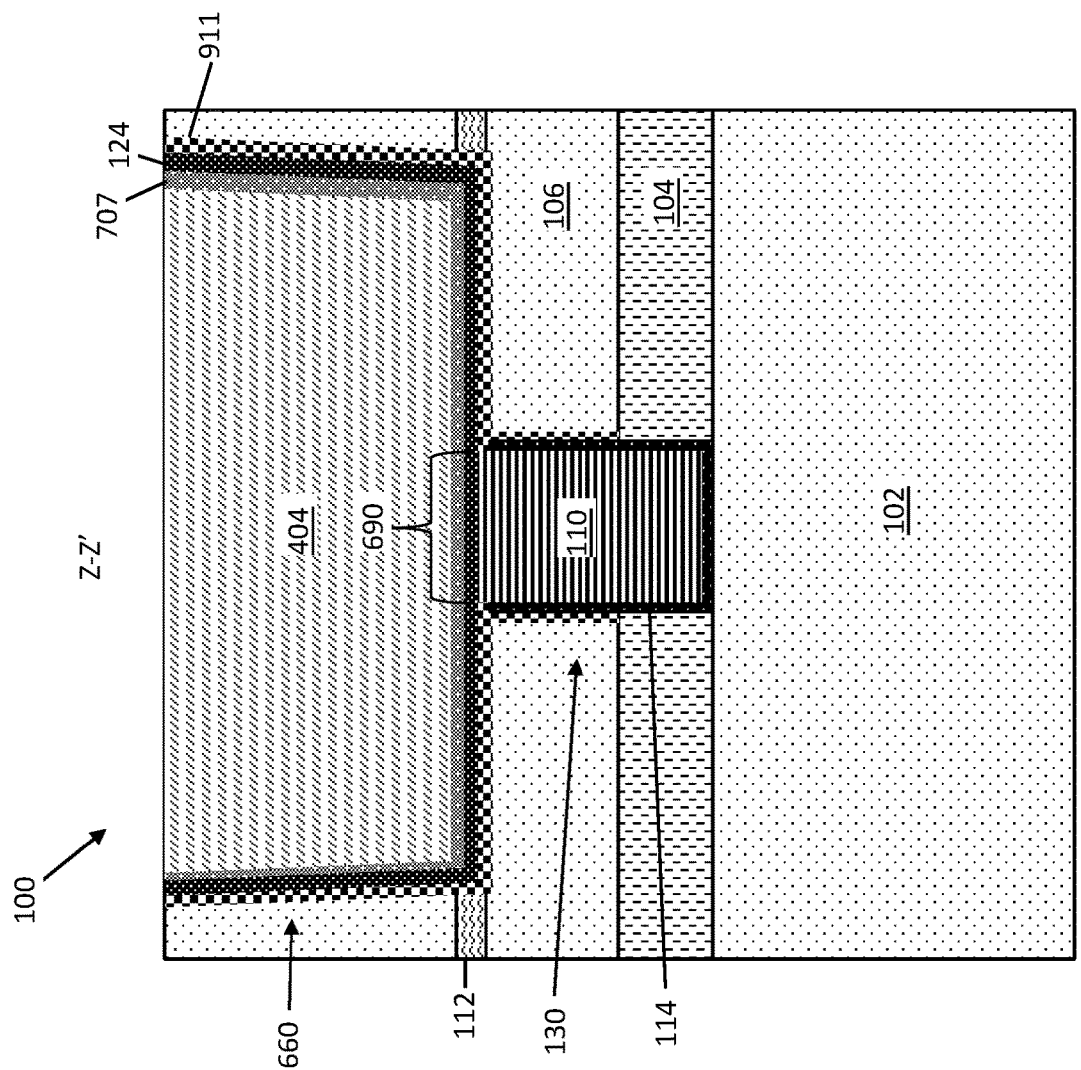

FIG. 12 depicts a cross-sectional side view of the semiconductor device 200 through the Z-Z' axis of FIG. 11. The metal 404 fill forms the metal line 660 arranged normal to the via 130 and forms the interconnect structure in the portion of the IC wafer 100.

The barrier layer 911 lines all sidewalls of the metal line 660, which prevents diffusion of the metal 404 into the IMD 106, 108. The barrier layer 911 also lines sidewalls of the via 130 in the IMD 106, which also prevents diffusion of the metal 110 into the IMD 106. The barrier layer 911 is not arranged at the interface 690 between the via 130 and the metal line 660.

Figure 13:
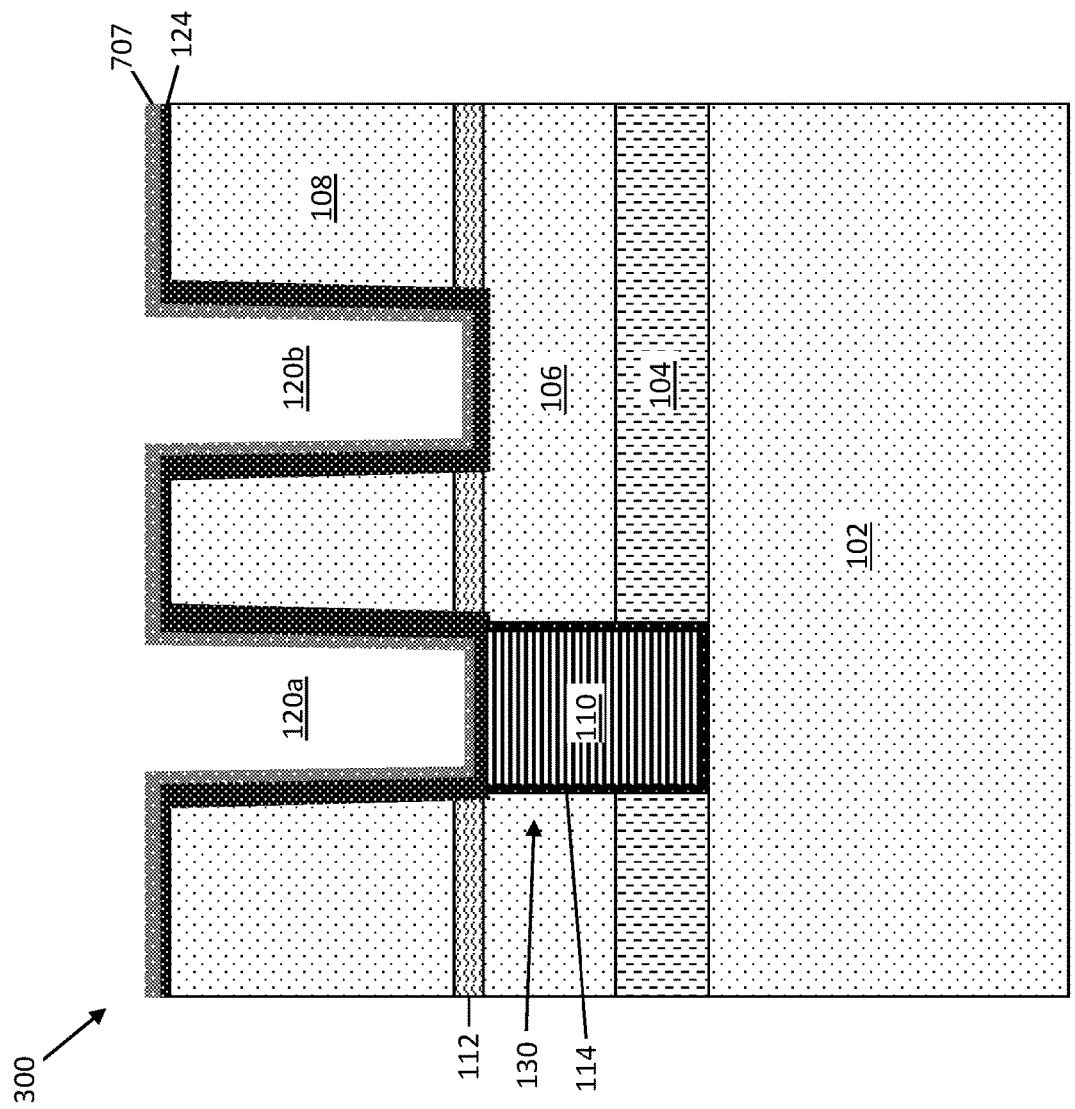

FIGS. 13-18 depict a process flow for forming a semiconductor device 300 according to embodiments of the present invention. FIG. 13 depicts a cross-sectional side view the semiconductor device 300, subsequent to depositing a seed layer 707 on a metal liner 124 within trenches 120a, 120b.

The seed layer 707 is deposited on the metal liner 124. The seed layer 707 includes at least two metals. The seed layer 707 is deposited by a deposition process, which can be PVD in one or more embodiments of the present invention. According to some embodiments of the present invention, the seed layer 707 includes copper (Cu) and manganese (Mn).

Figure 14:
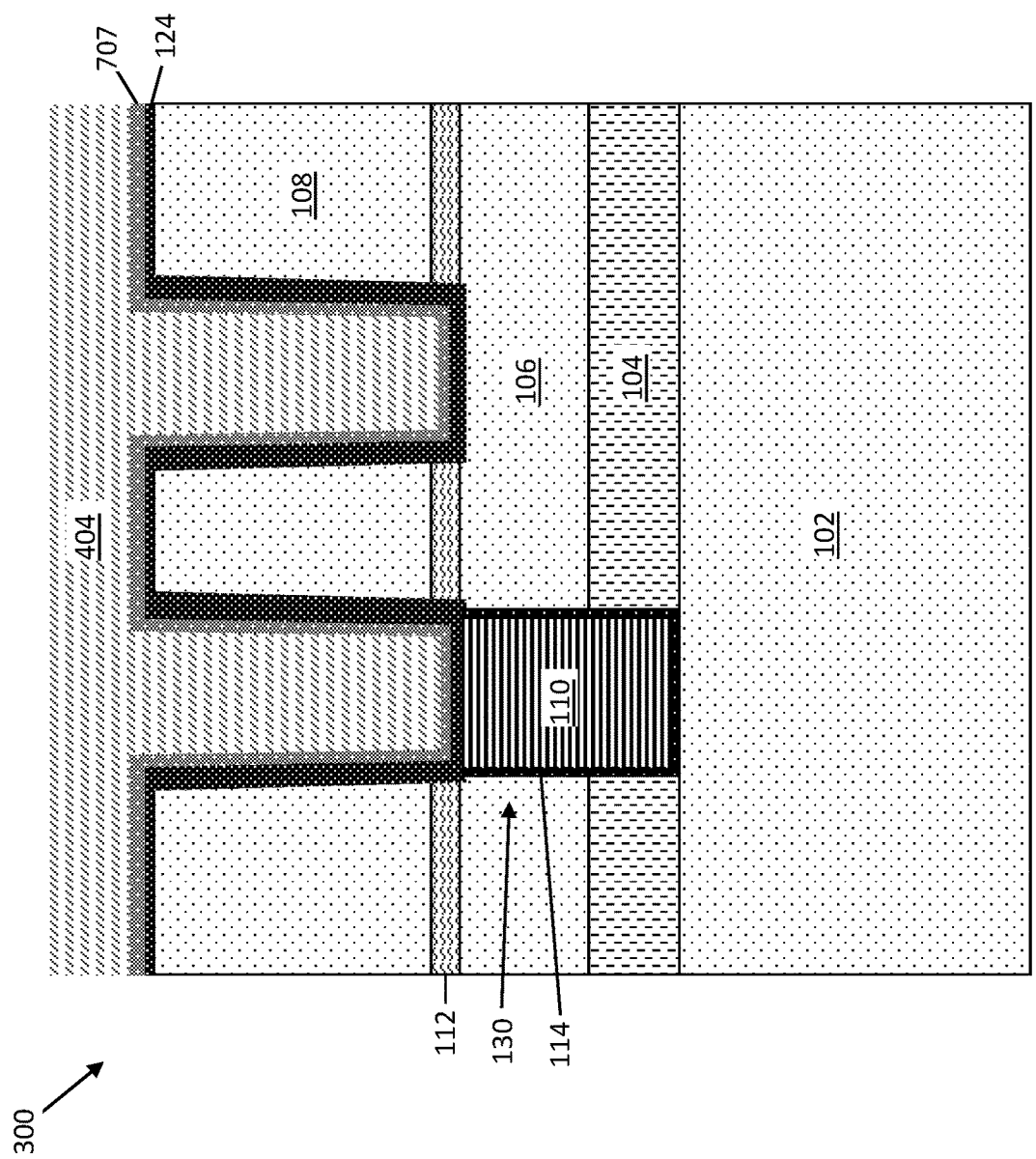

FIG. 14 depicts a cross-sectional side view of the semiconductor device 300, subsequent to depositing a metal 404 in the trenches 1201, 120b. The metal 404 is deposited directly onto the seed layer to fill the trenches 120a, 120b in the IMD 108.

The metal 404 can include a conductive metal, an alloy including at least one conductive metal, a conductive metal silicide or combinations thereof. The metal 404 can be a conductive metal, such as copper (Cu), tungsten (W), aluminum (Al), cobalt (Co), ruthenium (Ru), rhodium (Rh), platinum (Pt), or any combination thereof. The metal 404 is deposited by a deposition process, including, by not limited to, CVD, PECVD, sputtering, chemical solution deposition or plating that fills from the bottom upwards (e.g., a bottom-up plating process). In one or more embodiments of the present invention, the metal 404 includes ruthenium.

Figure 15:
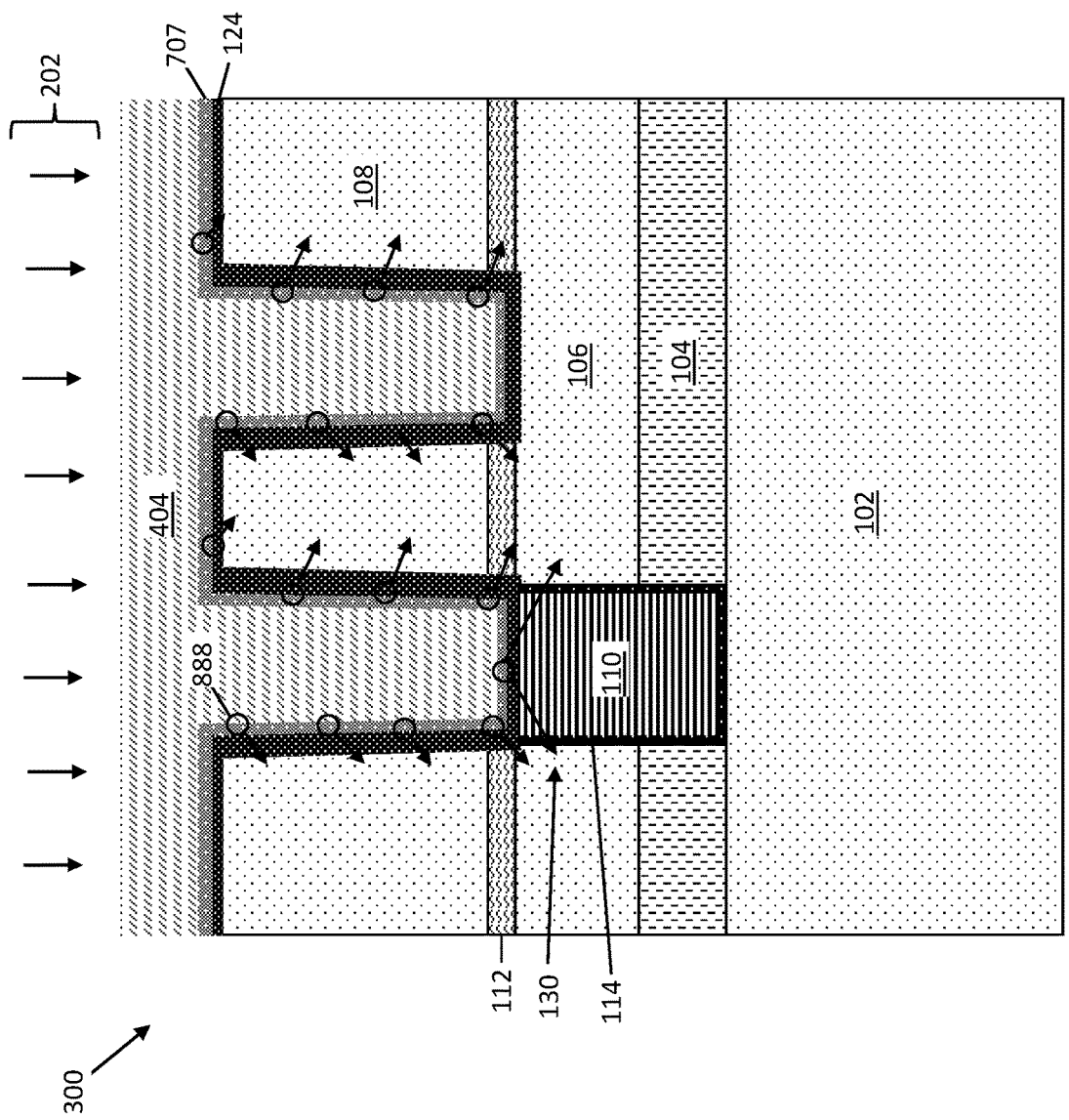

FIG. 15 depicts a cross-sectional side view of the semiconductor device 300 that illustrates performing an anneal on the seed layer 707. Annealing includes applying heat 202 to the semiconductor device 300. Annealing drives at least one metal 888 from the seed layer 707 through the metal liner 124 into the surrounding IMD 106, 108. Annealing can be performed as described above with respect to FIG. 2.

Figure 16:
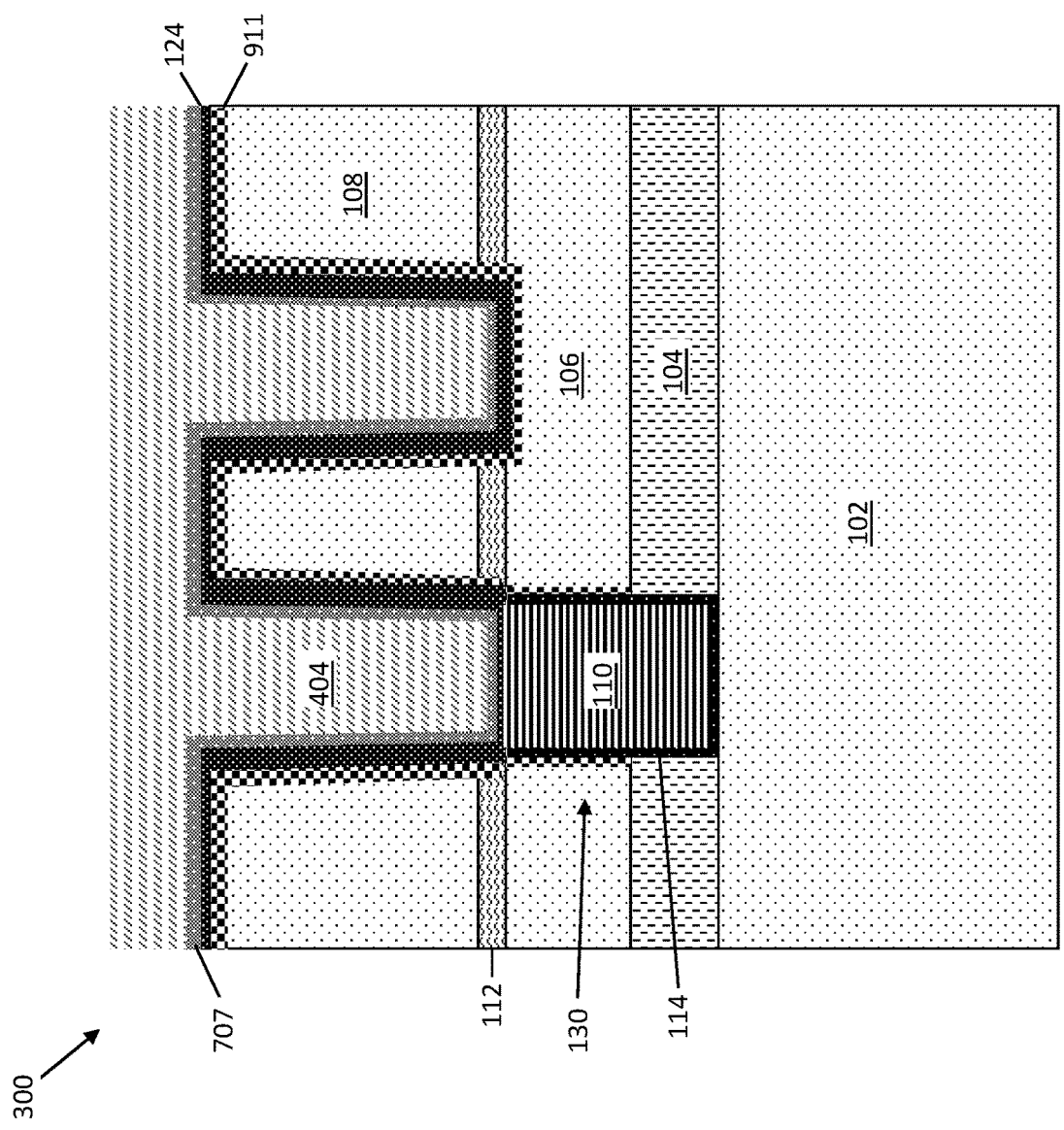

FIG. 16 depicts a cross-sectional side view of the semiconductor device 300, subsequent to forming a barrier layer 911 beneath the metal liner 124. One or more metals from the seed layer 707 (see FIG. 15) reacts with the material of the IMD 106, 108 and forms the material of the barrier layer 911. The barrier layer 911 lines the sidewalls of the trenches 120a, 120b and the via 130 that contact the IMD 106, 108. The barrier layer 911 includes a compound that results from a reaction of one or more of the metals 888 of the seed layer 707 and the IMD 106, 108. At least one metal remains in the seed layer 707.

According to one or more embodiments of the present invention, the metal 888 of the seed layer 707 includes Cu and Mn prior to the anneal, either one or both of the IMD 106, 108 includes $SiO_2$, and the resulting barrier layer 911 includes $MnSiO_3$. After the Mn diffuses into the IMD 106, 108, Cu remains in the seed layer 707.

Figure 17:
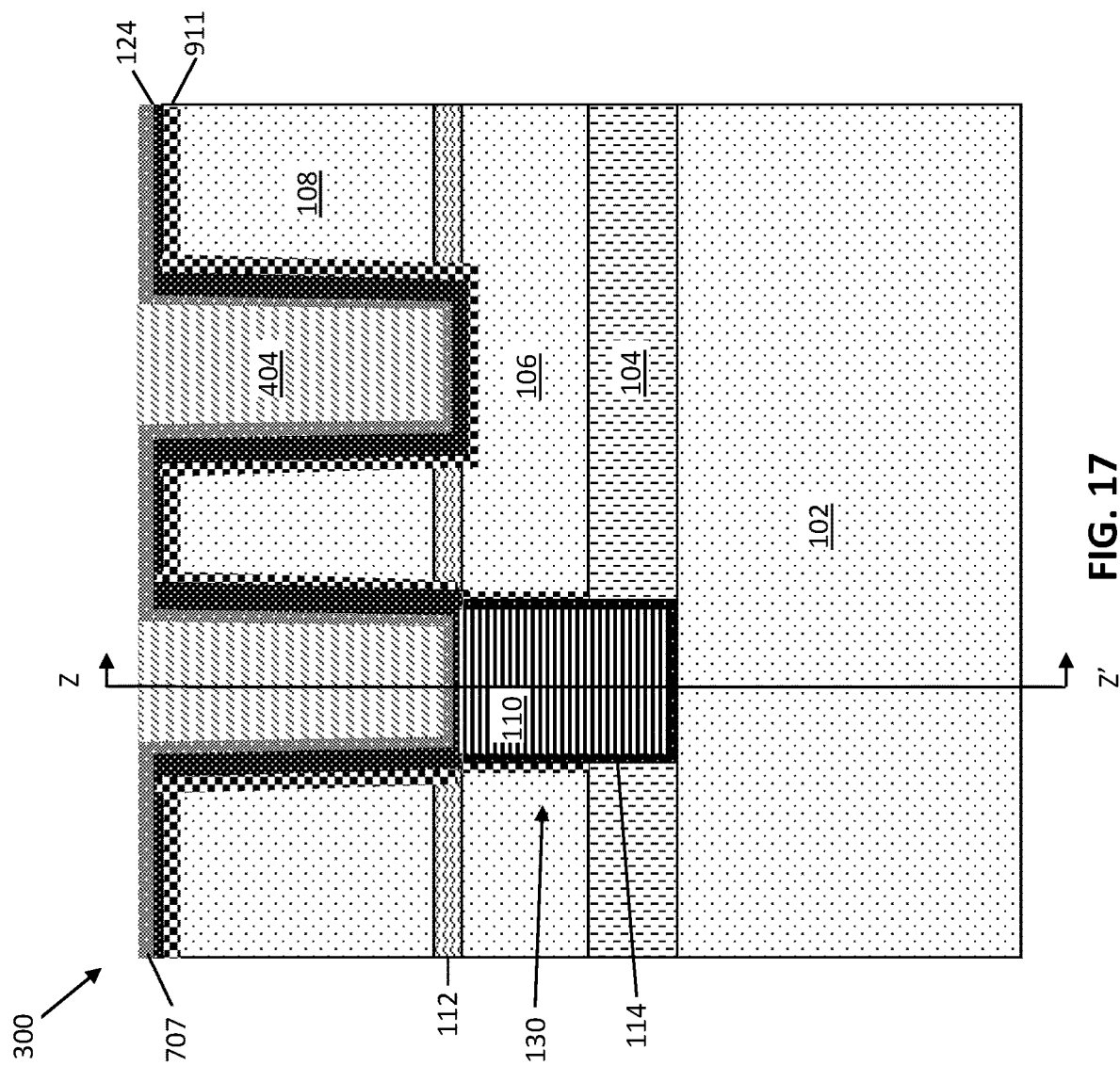

FIG. 17 depicts a cross-sectional side view of the semiconductor device 300, subsequent to planarizing the metal 404. The excess metal 404 arranged on the surface of the IMD 108 is removed by polishing, for example, by chemical mechanical planarization (CMP).

Figure 18:
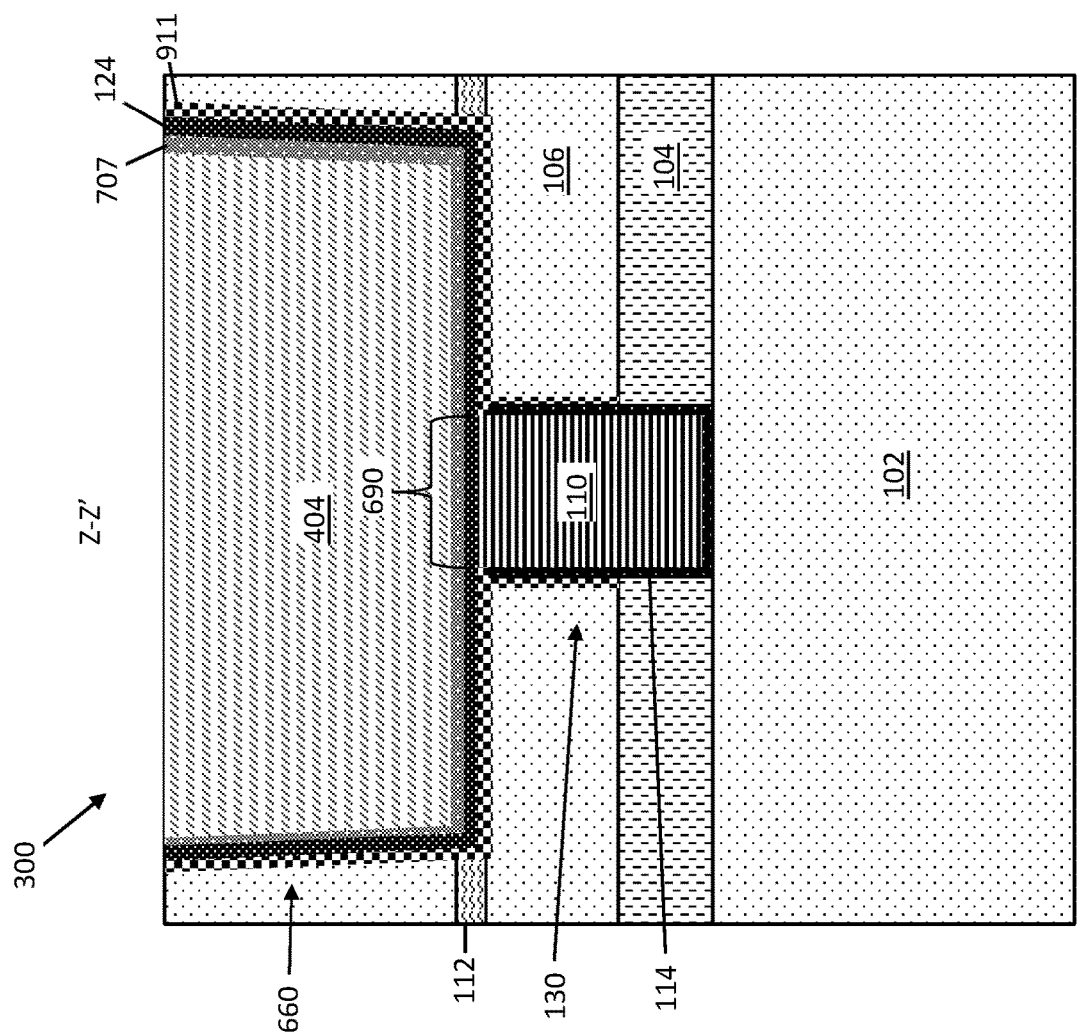

FIG. 18 depicts a cross-sectional side view of the semiconductor device 300 through the Z-Z' axis of FIG. 17. The metal 404 fill forms the metal line 660 arranged normal to the via 130 and forms the interconnect structure in the portion of the IC wafer 100.

The barrier layer 911 lines all sidewalls of the metal line 660, which prevents diffusion of the metal 404 into the IMD 106, 108. The barrier layer 911 also lines sidewalls of the via 130 in the IMD 106, which also prevents diffusion of the metal 110 into the IMD 106. The barrier layer 911 is not arranged at the interface 690 between the via 130 and the metal line 660.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a wafer, the method comprising:
depositing a metal liner followed by a seed layer in a trench arranged in an inter-metal dielectric (IMD), an end of the trench contacting a metal via of an interconnect structure, and the seed layer comprising a metal; and
applying heat to drive the metal of the seed layer into the IMD and form a barrier layer along sidewalls of the trench and at least partially along sidewalls of the metal via.

2. The method of claim 1, wherein the seed layer comprises manganese, copper, or a combination thereof.

3. The method of claim 1 further comprising depositing another metal to fill the trench.

4. The method of claim 3, wherein the another metal comprises copper, tungsten, aluminum, cobalt, ruthenium, rhodium, platinum, or any combination thereof.

5. The method of claim 1, wherein the barrier layer comprises a compound that results from reaction of the metal in the seed layer and a compound of the IMD.

6. The method of claim 1, wherein the seed layer is manganese.

7. The method of claim 1, wherein the seed layer comprises copper and manganese.

8. A method of fabricating a wafer, the method comprising:
depositing a metal liner following by a seed layer in a trench arranged in an inter-metal dielectric (IMD), an end of the trench contacting a metal via of an interconnect structure, the metal via comprising a metal fill, the seed layer comprising a first metal and a second metal; and
applying heat to drive the first metal into the IMD and form a barrier layer along a sidewall of the trench and at least partially along sidewalls of the metal via, the second metal remaining in the seed layer.

9. The method of claim 8, wherein the first metal of the seed layer comprises manganese.

10. The method of claim 9, wherein the second metal of the seed layer comprises copper.

11. The method of claim 8 further comprising depositing another metal to fill the trench.

12. The method of claim 11, wherein the another metal comprises copper, tungsten, aluminum, cobalt, ruthenium, rhodium, platinum, or any combination thereof.

13. The method of claim 8, wherein the barrier layer comprises a compound that results from reaction of the first metal and a compound of the IMD.

14. The method of claim 8, wherein the barrier layer comprises $MnSiO_3$.

* * * * *